United States Patent
Helm et al.

(10) Patent No.: US 7,265,012 B2
(45) Date of Patent: Sep. 4, 2007

(54) FORMATION OF STANDARD VOLTAGE THRESHOLD AND LOW VOLTAGE THRESHOLD MOSFET DEVICES

(75) Inventors: Mark Helm, Boise, ID (US); Xianfeng Zhou, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 11/216,632

(22) Filed: Aug. 31, 2005

(65) Prior Publication Data

US 2006/0003513 A1 Jan. 5, 2006

Related U.S. Application Data

(62) Division of application No. 10/931,891, filed on Sep. 1, 2004, which is a division of application No. 10/191,337, filed on Jul. 8, 2002, now Pat. No. 6,849,492.

(51) Int. Cl.
*H01L 21/8238* (2006.01)
*H01L 21/8234* (2006.01)
*H01L 21/8236* (2006.01)
*H01L 21/336* (2006.01)

(52) U.S. Cl. .............. 438/231; 438/275; 438/276; 438/221; 438/224; 438/289; 438/279; 438/119; 438/217; 438/203; 438/200; 438/199; 438/258; 438/266; 438/278; 438/211; 438/296; 257/371; 257/369; 257/E21.632; 257/E21.633; 257/E32.634

(58) Field of Classification Search ............... 438/231, 438/275, 276, 221, 224, 289, 279, 119, 217, 438/203, 200, 199, 258, 266, 278, 211, 296; 257/371, 369

See application file for complete search history.

(56) References Cited

U.S. PATENT DOCUMENTS

| | | | |
|---|---|---|---|
| 5,851,864 A | 12/1998 | Ito et al. | |
| 5,856,695 A | 1/1999 | Ito et al. | |
| 5,880,502 A | 3/1999 | Lee et al. | |
| 5,970,335 A | 10/1999 | Helm et al. | |

(Continued)

OTHER PUBLICATIONS

Edefors et al., Low-Power Design of Delay-Constrained Circuits Using Dual-VT Process Technology, p. 7.1.1-7.1.10.

(Continued)

*Primary Examiner*—Michael Lebentritt
*Assistant Examiner*—Mohsen Ahmadi
(74) *Attorney, Agent, or Firm*—Dinsmore & Shohl LLP

(57) ABSTRACT

Wells are formed in a substrate where standard Vt and low Vt devices of both a first and second type are to be fabricated. Wells defining the locations of first type standard Vt devices are masked, and a first voltage threshold implant adjustment is performed within wells defining the second type standard Vt devices, and each of the first and second type low Vt devices. Wells that define the locations of second type standard Vt devices are masked, and a second voltage threshold implant adjustment is performed to the wells defining the first type standard Vt devices, and each of the first and second type low Vt devices. Doped polysilicon gate stacks are then formed over the wells. Performance characteristics and control of each device Vt is controlled by regulating at least one of the first and second voltage threshold implant adjustments, and the polysilicon gate stack doping.

32 Claims, 7 Drawing Sheets

U.S. PATENT DOCUMENTS

| | | | |
|---|---|---|---|
| 6,096,611 | A | 8/2000 | Wu |
| 6,111,427 | A | 8/2000 | Fujii et al. |
| 6,133,611 | A | 10/2000 | Yamaguchi |
| 6,133,762 | A | 10/2000 | Hill et al. |
| 6,238,982 | B1 | 5/2001 | Krivokapic et al. |
| 6,268,250 | B1 * | 7/2001 | Helm .................. 438/275 |
| 6,288,573 | B1 | 9/2001 | Tanizaki et al. |
| 6,297,082 | B1 * | 10/2001 | Lin et al. .................. 438/217 |
| 6,369,606 | B1 | 4/2002 | Houghton et al. |
| 6,580,142 | B1 * | 6/2003 | Pezzani .................. 257/500 |

OTHER PUBLICATIONS

Tyagi et al., A 130 nm Generation Logic Technology Feturing 70 nm Transistors, Dual VT Transistors and 6 Layers of Cu Interconnects, Portland Technology Development, #QRE, *TCAD Intel Corporation, p. 1-30.

* cited by examiner

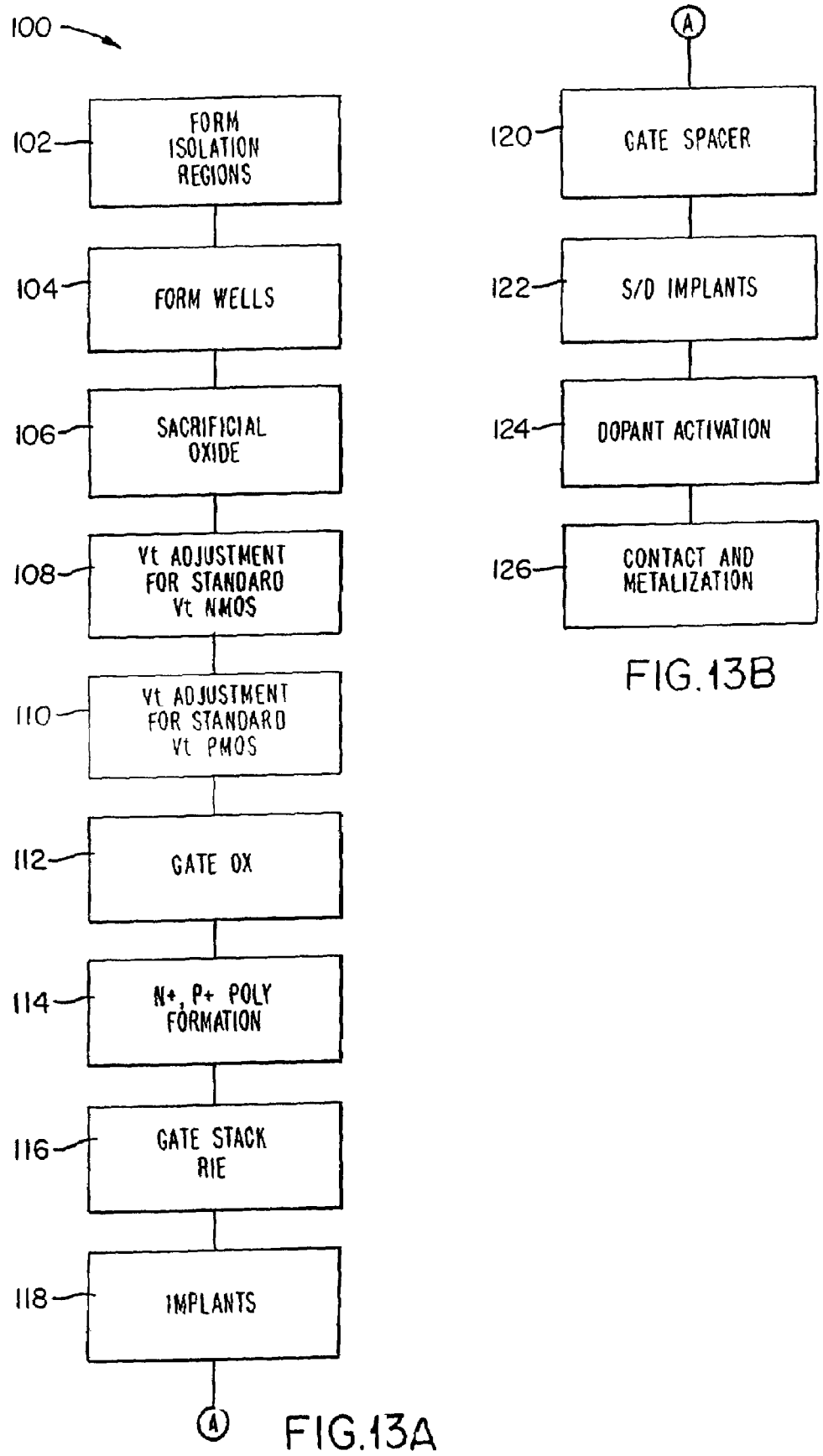

FORMATION OF STANDARD VOLTAGE THRESHOLD AND LOW VOLTAGE THRESHOLD MOSFET DEVICES

CROSS REFERENCE TO RELATED APPLICATIONS

This application is a division of U.S. patent application Ser. No. 10/931,891, filed Sep. 1, 2004 (MIO 0095 VA/01-1271.01), which is a division of U.S. patent application Ser. No. 10/191,337, filed Jul. 8, 2002 (MIO 0095 PA/01-1271), now U.S. Pat. No. 6,849,492. This application is also related to U.S. patent application Ser. No. 11/146,812, filed Jun. 7, 2005 (MIO 0095 V2/01-1271.02), which is also a division of U.S. patent application Ser. No. 10/191,337, now U.S. Pat. No. 6,849,492.

BACKGROUND OF THE INVENTION

The present invention relates in general to methods of fabricating electrical circuit components and in particular to methods of fabricating devices comprising both standard voltage threshold transistors and low voltage threshold transistors.

Standard voltage threshold (Vt) metal oxide semiconductor field effect transistor (MOSFET) devices can function to limit current when their gate voltage is not biased with respect to the voltage threshold. Accordingly, standard Vt MOSFET devices are suitable for complimentary metal oxide semiconductor (CMOS) circuit applications where power dissipation is of concern to the circuit designer. Lowering the voltage threshold of the MOSFET device however, generally increases the device switching performance. Accordingly, low Vt MOSFET devices are suitable for CMOS applications where fast switching is of concern to the designer. A low Vt MOSFET device is more likely to experience leakage current as compared to a standard Vt MOSFET device however. Likewise, a standard Vt MOSFET device may switch slower than a relatively lower Vt MOSFET device.

Accordingly, it is advantageous to incorporate MOSFET devices that operate at multiple voltage thresholds into CMOS circuits. For example, standard Vt MOSFET devices can be used to reduce power dissipation when a circuit is operating in standby mode. Low Vt MOSFET devices are often capable of driving relatively high current and can potentially increase the maximum overall speed of an electrical circuit because relatively lower Vt MOSFET devices typically exhibit faster switching characteristics than a corresponding relatively higher Vt MOSFET device.

The combination of standard Vt and low Vt MOSFET devices in a single substrate complicates the manufacture of CMOS circuits. For example, multiple masking, implanting, and other processing steps are typically necessary to create standard and low Vt PMOS as well as the standard and low Vt NMOS devices. Each processing step increases the complexity of the fabrication process and potentially reduces yield due to the increased potential for possibility defects. As the packing density of complex circuit arrays increases, the potential for reduced yield further increases.

SUMMARY OF THE INVENTION

The present invention overcomes the disadvantages of previously known methods of forming standard and low Vt devices by constructing low Vt devices in the same processing steps as standard Vt devices.

According to one embodiment of the present invention, a plurality of wells are formed in a substrate. The plurality of wells define regions of the substrate where standard Vt and low Vt devices of both a first and second type are to be fabricated. For example, wells are formed in locations where standard Vt NMOS, standard Vt PMOS, low Vt NMOS, and low Vt PMOS devices are to be fabricated. The wells that define the locations of standard Vt devices of the first type are masked, and a first voltage threshold implant adjustment is performed to the wells defining the standard Vt devices of the second type, and each of the low Vt devices for both the first and second types.

The wells that define the locations of standard Vt devices of the second type are masked, and a second voltage threshold implant adjustment is performed to the wells defining the standard Vt devices of the first type, and each of the low Vt devices for both the first and second types. Polysilicon gate stacks are then formed over the wells. The polysilicon gates are doped with a dopant corresponding to the type of well the polysilicon gate stack is built upon. For example, according to one embodiment of the present invention, N+ polysilicon gate stacks are formed over P-type wells, and P+ polysilicon gate stacks are formed over N-type wells. Performance characteristics and control of each device Vt is controlled by regulating at least one of the first and second voltage threshold implant adjustments to the wells, and the doping of the polysilicon gate stacks. For example, according to one embodiment of the present invention, controlling the concentration and energy of the voltage threshold implant adjustments, and the differentiation of N+ and P+ polysilicon gates enables the fabrication of standard and low Vt NMOS and PMOS devices and allows control of device Vt and device performance characteristics.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques, including those techniques currently used in the art. As such, not all commonly practiced process steps are disclosed herein. Certain commonly practiced process steps are included in the description herein for example, to provide contextual reference, for illustrative or exemplary purposes, or as is necessary for an understanding of the present invention.

Also, as used herein, the formation of a layer or region "over" a substrate or other layer refers to formation above, or in contact with, a surface of the substrate or layer. For example, where it is noted or recited that an insulating layer is formed over a substrate, it is contemplated that intervening structural layers may optionally be present between the insulating layer and the substrate.

Figure 1:
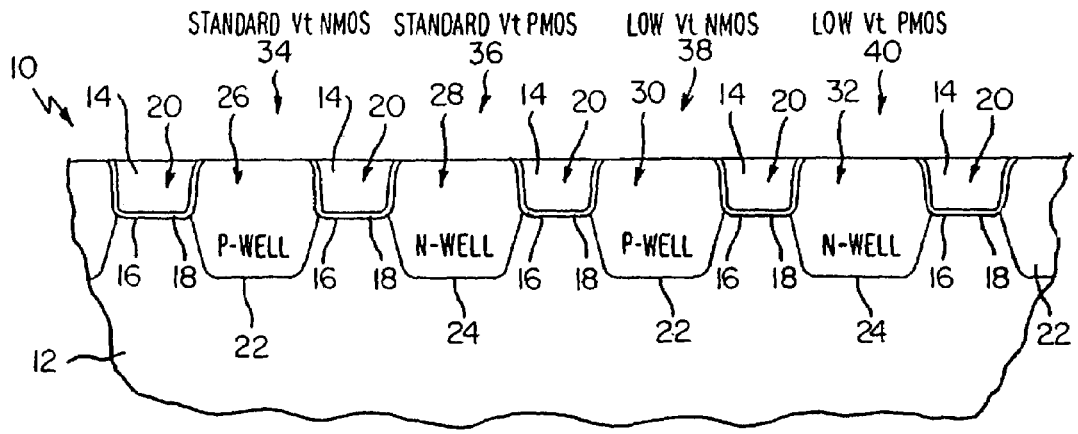
FIG. 1 is a diagrammatic section view of a process for the fabrication of low and standard voltage devices including a standard voltage first device type, a standard voltage second device type, a low voltage first device type, and a low voltage second device type according to one embodiment of the present invention, wherein wells and isolation regions are formed in a substrate.

Fabrication of a Dual Vt CMOS Device. FIGS. 1–11 illustrate processing steps for the fabrication of dual Vt CMOS devices. Referring initially to FIG. 1, a dual Vt CMOS device 10 according to one embodiment of the present invention is fabricated on a base substrate 12. The base substrate 12 may comprise any semiconductor material or combination of materials as is known in the art. For example, the base substrate 12 may comprise silicon (Si), gallium arsenide (GaAs) or other semiconductor materials such as hiP, CdS, or CdTe.

Initially, a plurality of isolation regions 14 are formed in the base substrate 12. Each isolation region 14 comprises a shallow trench isolation (STI) region as illustrated. Basically, shallow trenches 16 are formed in the base substrate 12, an optional first oxide layer 18 is formed so as to line the each trench 16, and a first dielectric material 20 is used to fill in each trench 16 over the optional first oxide layer 18. The trenches 16 may contain additional layers or have a geometry that differs from that shown in the Figures depending upon the isolation characteristics desired for a specific application. Further, any known processes may be used to form the isolation regions 14.

For example, the trenches 16 may be formed using an anisotropic, reactive ion etching process. After filling the trenches 16 with the first dielectric material 20 such as by low pressure chemical vapor deposition (LPCVD) or plasma enhanced chemical vapor deposition (PECVD) procedures, a chemical mechanical polishing (CMP) procedure is used to remove unwanted regions of the first dielectric material 20. The upper portion of the first dielectric material 20 is planar and generally parallel to the surface of the base substrate 12 as is shown in FIG. 1. However, a small convex surface in the upper portion of the first dielectric material 20 (not shown) may result depending upon the STI trench formation techniques used. A small convex surface extending above the surface of the base substrate 12 will not affect the present invention.

Also, while STI is shown, any isolation forming techniques may be practiced with the present invention, including for example, LOCOS and other field oxide techniques. One example of an alternative to STI is to apply a silicon nitride masking layer over the base substrate 12 except in locations where isolation regions are to be formed. A thermal oxidation process is applied to the regions of the base substrate 12 not masked by the silicon nitride to grow the field oxide isolation regions.

A plurality of P-type wells 22 and a plurality of N-type wells 24 are also formed in the base substrate 12. Well formation is preferably performed after forming the isolation regions 14, but may be performed prior thereto or concomitantly therewith. For example, if the isolation regions 14 are formed using STI techniques, well ion implants may be optionally embedded into the base substrate 12 through the trenches 16 prior to filling the trenches 16 with the first dielectric material 20. The P-type wells 22 and the N-type wells 24 collectively define the locations of the N-channel and P-channel devices to be constructed, thus the precise well locations and well ion implants will be application specific.

One manner of forming P-type wells is to implant a P-type dopant into the base substrate 12. The P-type dopant may include for example, a trivalent element such as boron.

Likewise, one manner of forming N-type wells is to implant an N-type dopant into the base substrate 12. The N-type dopant may include for example, a pentavalent element such as phosphorous.

There are four retrograde well regions shown in FIG. 1, including a first P-well 26, a first N-well 28, a second P-well 30, and a second N-well 32. The active area of the first P-well 26 defines a standard Vt NMOS region 34 (also referred to herein as a standard voltage first type region) and represents the general location where a standard Vt NMOS device such as a standard Vt NMOS transistor is to be built. The active area of the first N-well 28 defines a standard Vt PMOS region 36 (Also referred to herein as a standard voltage threshold second type region) and represents the general location where a standard Vt PMOS device such as a standard Vt PMOS transistor is to be built. The active area of the second P-well 30 defines a low Vt NMOS region 38 (also referred to herein as a low voltage threshold first type region) and represents the general location where a low Vt NMOS device such as a low Vt NMOS transistor is to be built. Similarly, the active area of the second N-well 32 defines a low Vt PMOS region 40 (also referred to herein as a low voltage threshold second type region) and represents the general location where a low Vt PMOS device such as a low Vt PMOS transistor is to be built.

It will be appreciated that the construction of a standard Vt NMOS, a standard Vt PMOS, a low Vt NMOS, and a low Vt PMOS devices in the order shown in FIG. 1 is for the purpose of facilitating discussion of the present invention. It is not limiting in the manner and organization of the various MOSFET devices according to the various embodiments of the present invention herein that may be constructed for a particular application. It will also be appreciated that at times, the description herein will refer to various formations including for example, wells, regions, and devices as being either a first type or a second type. The designation of a first type and a second type is used to merely differentiate the structures being discussed. For example, a first type structure may comprise an N-type structure, and a second type structure may comprise a P-type structure. Likewise, a first type structure may comprise a P-type structure and a second type structure may comprise an N-type structure.

Although retrograde wells are shown in the Figures herein, other well formation techniques may be used to form wells compatible with the various embodiments of the present invention. For example, diffusion wells may be used in conjunction with, or in lieu of the retrograde wells shown. The specific application will dictate the techniques used to form the wells. Diffusion or other well forming techniques may also be formed prior to, subsequent to, or concomitantly with the formation of the isolation regions 14.

Figure 2:
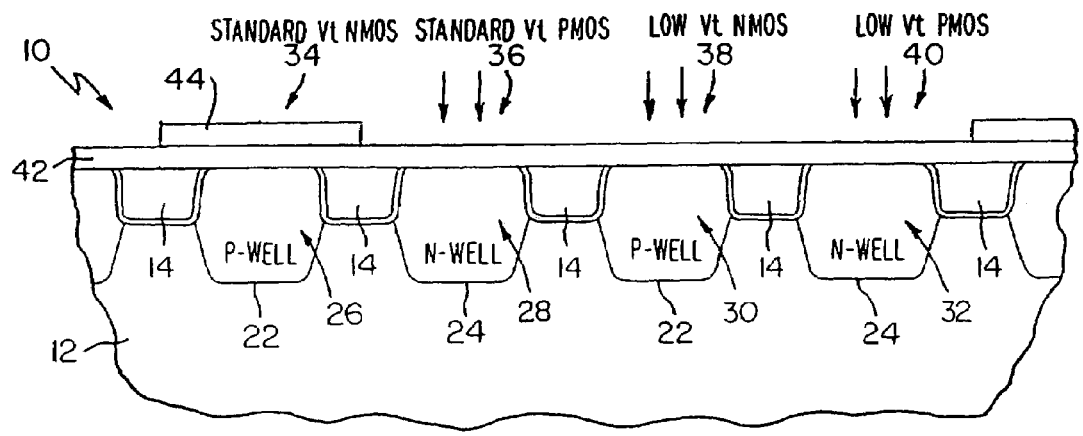
FIG. 2 is a diagrammatic section view of a process for the fabrication of low and standard voltage devices according to one embodiment of the present invention wherein a first mask is patterned over the substrate shown in FIG. 1.

Referring to FIG. 2, an optional sacrificial oxide layer 42 is formed over the base substrate 12. A first mask 44 is then placed over the base substrate 12 so as to overlie the standard Vt NMOS region 34, which is defined generally about the first P-type well 26. In practical applications, this may comprise masking more than one region of the base substrate 12. The standard Vt PMOS region 36, as well as the low Vt PMOS and NMOS regions 38, 40 are left open (unmasked). A first Vt adjustment is performed with the first mask 44 in place. For example, any suitable ion implant, such as an implant of Arsenic, may be used to dope the first N-type well 28, the second P-type well 30, and the second N-type well 32.

Figure 3:
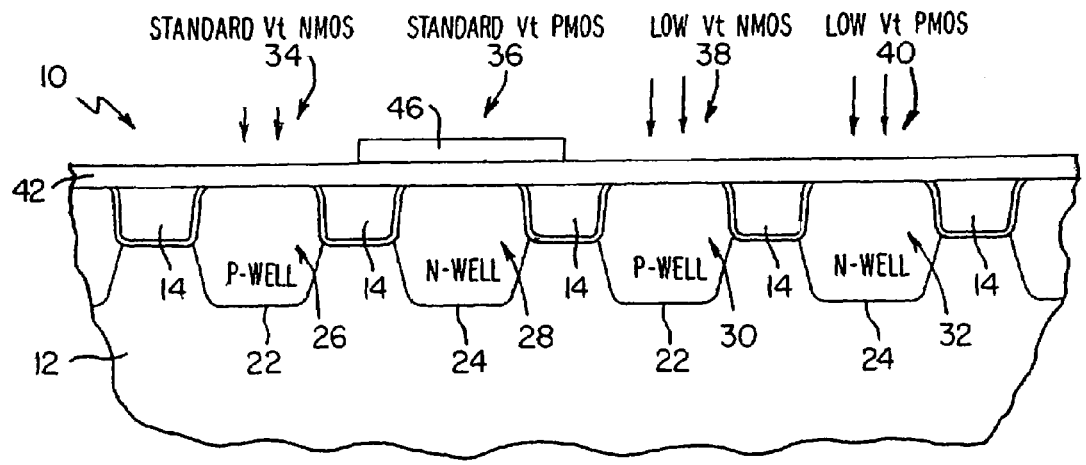
FIG. 3 is a diagrammatic section view of a process for the fabrication of low and standard voltage devices according to one embodiment of the present invention wherein the first mask is removed and a second mask is patterned over the substrate shown in FIG. 1.

Referring to FIG. 3, the first mask has been removed, and a second mask 46 is placed over the base substrate 12 so as to overlie the standard Vt PMOS region 36, which is defined generally about the first N-type well 28. Again, in practical applications, this may comprise masking more than one region of the base substrate 12. The standard Vt NMOS region 34, as well as the low Vt PMOS and NMOS regions 38, 40 are left open (unmasked). A second Vt adjustment is performed with the second mask 46 in place. For example, any suitable ion implant, including a boron type of implant such as BF2, or Indium may be used to dope the first P-type well 26, the second P-type well 30, and the second N-type well 32.

The order of the first and second masks and the associated Vt adjustment implants may be switched such that the standard Vt PMOS region masked, and the corresponding second Vt adjustment is performed prior to masking the standard voltage NMOS region and performing the first Vt adjustment.

Figure 4:
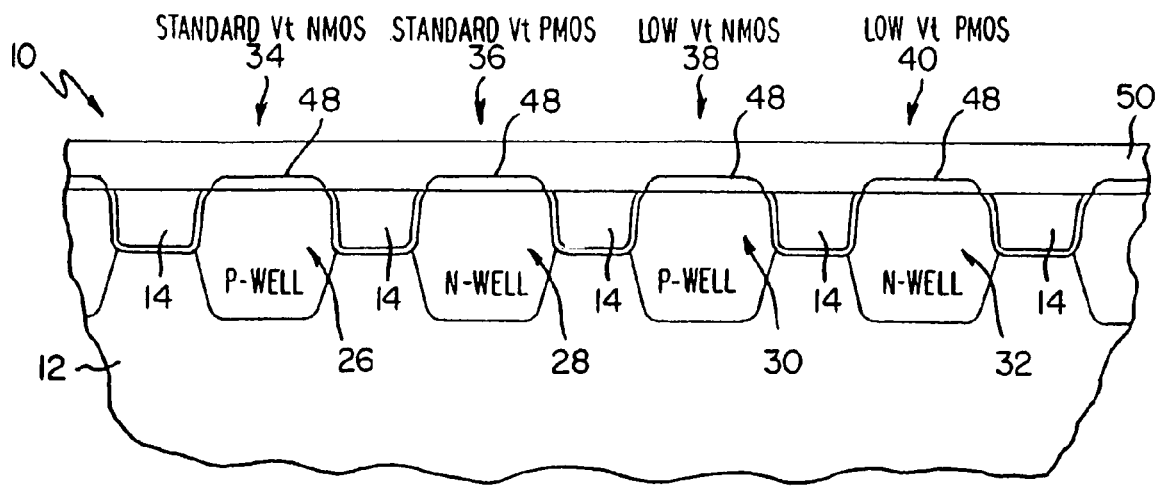
FIG. 4 is a diagrammatic section view of a process for the fabrication of low and standard voltage devices according to one embodiment of the present invention wherein the second mask shown in FIG. 3 is removed, a gate oxide layer is formed, a conductive layer is formed over the gate oxide layer.

Referring to FIG. 4, the sacrificial oxide is removed from the base substrate 12, and a gate oxide 48 is formed. The gate oxide 48 may be grown by thermal oxidation of the base substrate 12, or the gate oxide 48 may be formed by other conventional techniques such as chemical vapor deposition (CVD). It will be appreciated that when growing the gate oxide 48, the oxide will form on any exposed silicon surface, thus removal of portions of the gate oxide 48 from the surface of the base substrate 12 may be required as the specific application dictates. A conductive gate layer 50 is formed over the base substrate 12 and gate oxide 48. The conductive layer is preferably a polysilicon gate layer and may be formed using any number of processing techniques including LPCVD.

Figure 5:
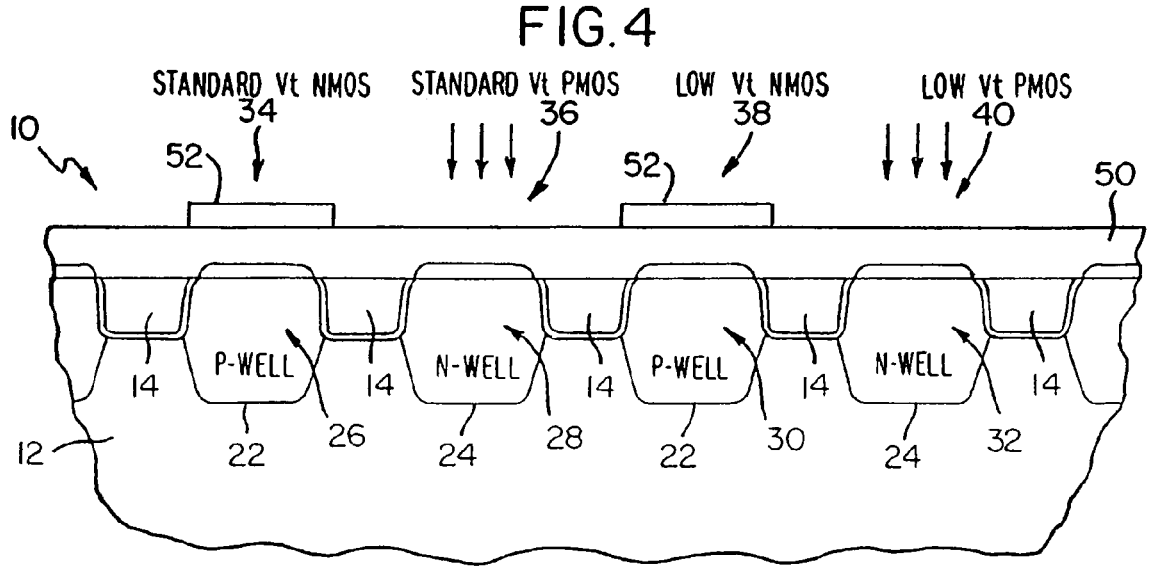
FIG. 5 is a diagrammatic section view of a process for the fabrication of low and standard voltage devices according to one embodiment of the present invention wherein a third mask is formed over the first device types shown in FIG. 4.

Referring to FIG. 5, a third mask 52 is formed over the conductive gate layer 50 so as to overlie the P-type wells 22. That is, the third mask 52 overlies the standard Vt NMOS region 24 and the low Vt NMOS region 28 leaving the standard Vt PMOS region 36 and the low Vt PMOS region 40 open (unmasked). The conductive gate layer 50 is then heavily doped in the areas defined about the standard Vt PMOS region 36 and the low Vt PMOS region 40 with a P-type impurity such as Boron.

Figure 6:
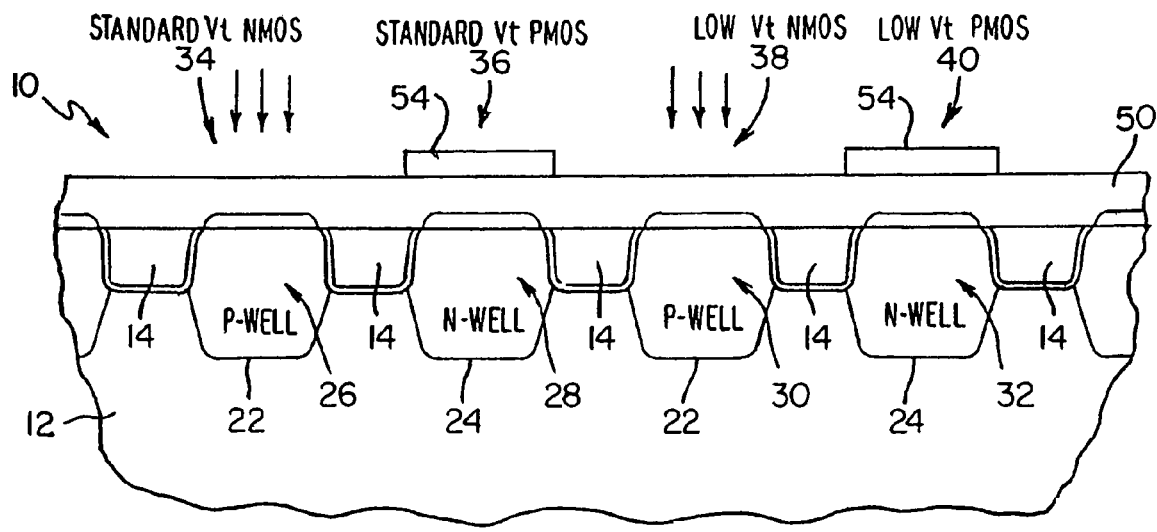
FIG. 6 is a diagrammatic section view of a process for the fabrication of low and standard voltage devices according to one embodiment of the present invention wherein the third mask shown in FIG. 5 is removed, and a fourth mask is formed over the second device types.

Referring to FIG. 6, the third mask is removed, and a fourth mask 54 is formed over the conductive gate layer 50 so as to overlie the N-type wells 24. That is, the fourth mask 54 overlies the standard Vt PMOS region 36 and the low Vt PMOS region 40 leaving the standard Vt NMOS region 34 and the low Vt NMOS region 38 open (unmasked). The conductive gate layer 50 is then heavily doped in the areas defined by about the standard Vt NMOS region 34 and the low Vt NMOS region 38 with an N-type impurity such as phosphorous. After the appropriate ion implants into the conductive gate layer 50 as shown in FIGS. 5 and 6, the gate conductor may optionally be annealed. Also, the order in which the conductive gate layer 50 is doped may reversed from that described above. Depending upon the composition of the gate conductor, no doping may be required.

Figure 7:
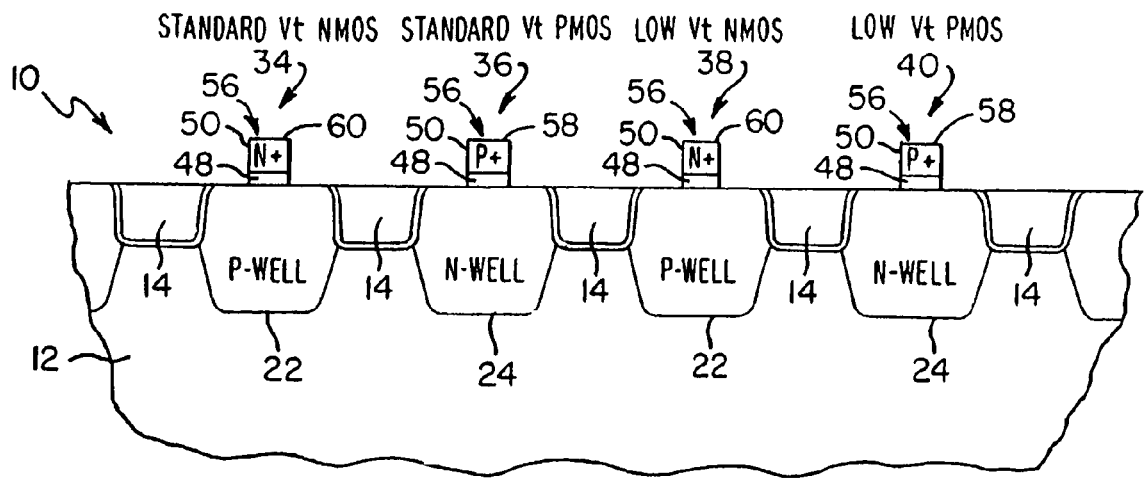
FIG. 7 is a diagrammatic section view of a process for the fabrication of low and standard voltage devices according to one embodiment of the present invention wherein the fourth mask shown in FIG. 6 is removed and portions of the conductive layer are removed to define gate stacks.

Referring to FIG. 7, portions of the conductive gate layer 50 are removed defining gate stacks 56. For example, an anisotropic etching process, such as RIE may be used to form the gate stacks 56. As shown, there is one gate stack 56 over each of the N-type wells 22 and one gate stack 56 over each of the P-type wells 24. The conductive gate layer 50 in the gate stacks 56 over the N-type wells 24 defines P+ poly gates 58, and the conductive gate layer 50 in the gate stacks 56 over the P-type wells 22 defines N+ poly gates 60.

Figure 8:
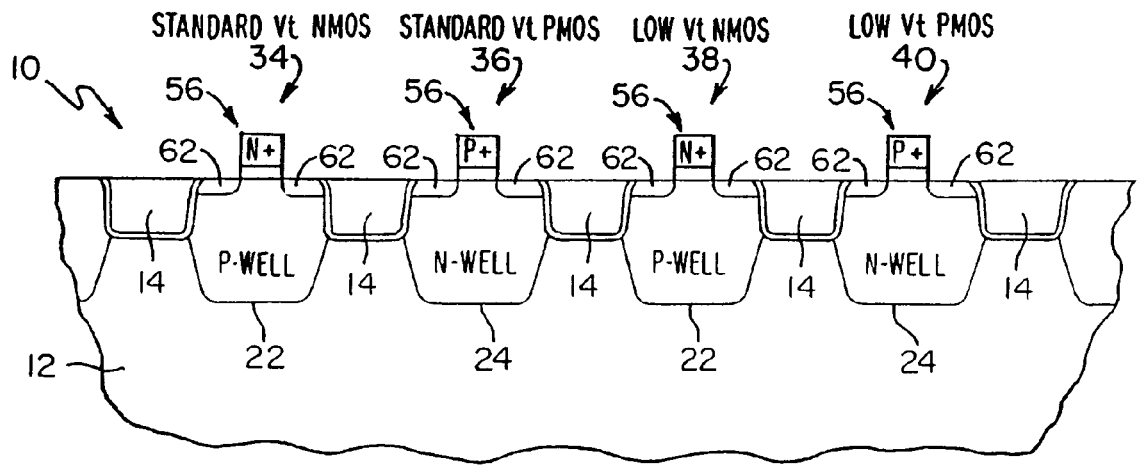
FIG. 8 is a diagrammatic section view of a process for the fabrication of low and standard voltage devices according to one embodiment of the present invention wherein lightly doped drain regions are formed in the substrate about the gate stacks shown in FIG. 7.

Referring to FIG. 8, any number of optional implants may be performed. For example, it may be desirable to reduce channel resistance or increase speed parameters of various devices being fabricated. As shown, an ion implant is used to form optional lightly doped drain regions (LDD) 62.

Alternatively, modern drain extension techniques including laterally abrupt extension formations may be used. According to one embodiment of the present invention, each gate stack 56 acts as a mask for the implant process, thus the lightly doped drain regions 62 "self align" with the gate stacks 56. The lightly doped drain regions 62 are preferably shallow in the vertical direction to prevent punch through effects when the device is off.

Other types of implants may also optionally be performed at this time. For example, short channel performance of MOSFET devices may be improved by the use high-angle implantation techniques such as halo implants. For example, halo implants may be used to reduce the Vt roll-off from drain induced barrier lowering to reduce subthreshold leakage current of CMOS devices.

Figure 9:
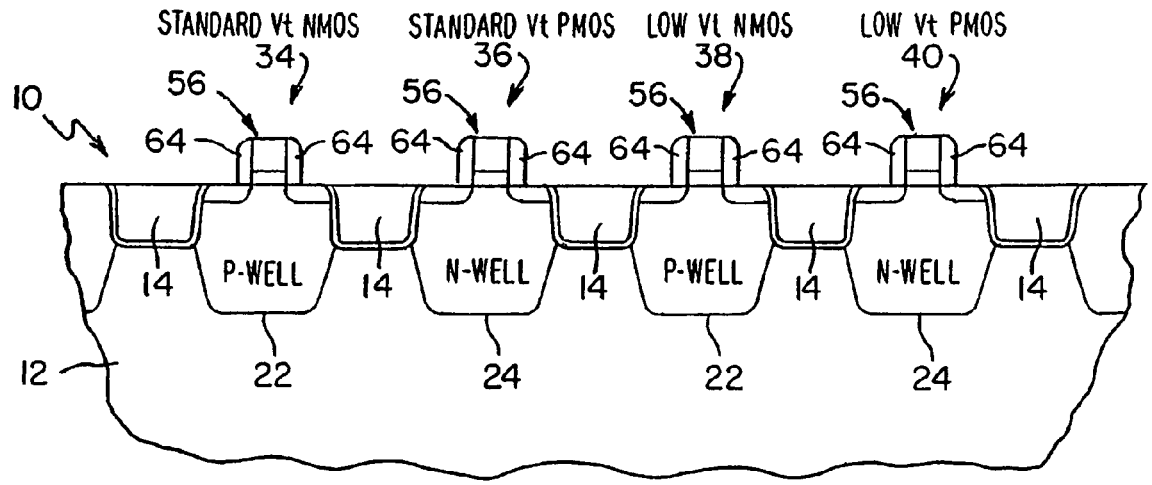
FIG. 9 is a diagrammatic section view of a process for the fabrication of low and standard voltage devices according to one embodiment of the present invention wherein spacers are formed about the gate stacks shown in FIG. 8.

Referring to FIG. 9, a spacer layer is formed over the base substrate 12 and etched back defining side spacers 64 about the gate stacks 56. For example, a generally conformal spacer layer such as oxide or nitride may be deposited using a chemical vapor deposition (CVD) process. Portions of the spacer layer are then removed to define spacers 64 against the vertical walls of the gate stacks 56. The spacers 64 may have upper edges that are rounded or curved, and may be formed for example, by applying a directed reactive ion beam etch downwardly onto the substrate. It shall be appreciated that other anisotropic etch processing techniques may also be used.

Figure 10:
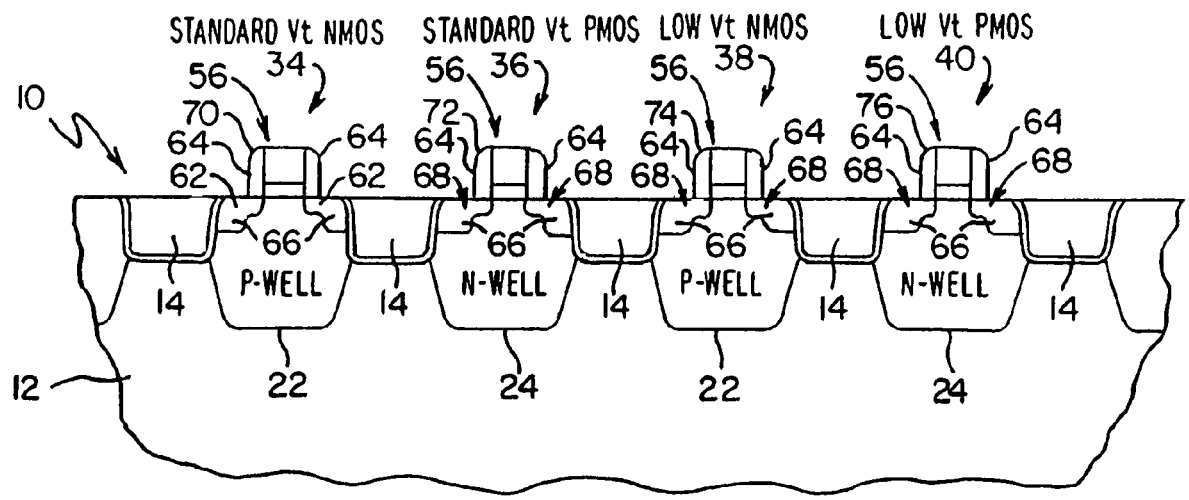
FIG. 10 is a diagrammatic section view of a process for the fabrication of low and standard voltage devices according to one embodiment of the present invention wherein source drain regions are formed in the substrate shown in FIG. 9.

Referring to FIG. 10, after forming the spacers 64, a further ion implantation is optionally performed to further define the source/drain regions of each PMOS and NMOS device. The ion implant is at a higher concentration and energy than that used to form the LDD regions 62, and is thus the doped regions 66 illustrated as having a deeper penetration into the base substrate 12 adjacent to the portion of the LDD regions 62 underneath the spacers 64. The LDD regions 62 and the doped regions 66 jointly define the doped source/drain regions 68. It will be appreciated that depending upon the intended application, one or both of the implant steps used to form the source/drain regions 68 may be eliminated from the manufacturing steps. It will further be appreciated that the source/drain regions 68 may be implanted during other processing steps.

According to one embodiment of the present invention, fabrication processing steps illustrated with respect to FIGS. 5–6 involving the doping of the polysilicon gate stacks are skipped, and performed during the formation of the source/drain region discussed with reference to FIG. 10. One reason that this is possible, it that that masking patterns required to perform the P+ and N+ polysilicon gate formation are generally similar to the masking patterns required to form the source/drain regions. Whether or not the fabrication processing techniques described with reference to FIGS. 4 and 5 may be omitted and combined with the fabrication steps described with reference to FIG. 10 will depend upon the requirements of the specific application. For example, a specific application may require that the concentration of doping necessary to form suitable polysilicon gate stacks is substantially different from the doping required to form the extensions to the source drain regions. Where the doping requirements between the source/drain extensions and the polysilicon conductive gate layer differ substantially, it is desirable to perform the doping of each in a separate processing operation.

Once all of the ion implants have been performed, the dual Vt CMOS device 10 may be annealed if necessary, at a relatively high temperature to activate various ones of the dopants and the ion implants heretofore discussed. The anneal process may also help remove some damage caused to the substrate 12 as the ions that have been implanted impregnate the base substrate 12. For example, a rapid thermal anneal (RTA) process or other processing techniques may be used as the technology allows, and the application dictates. As a result of the processing described with reference to FIGS. 1–10, a standard Vt NMOS device 70, a standard Vt PMOS device 72, a low Vt NMOS device 74, and a low Vt PMOS device 76 are realized.

Figure 11:
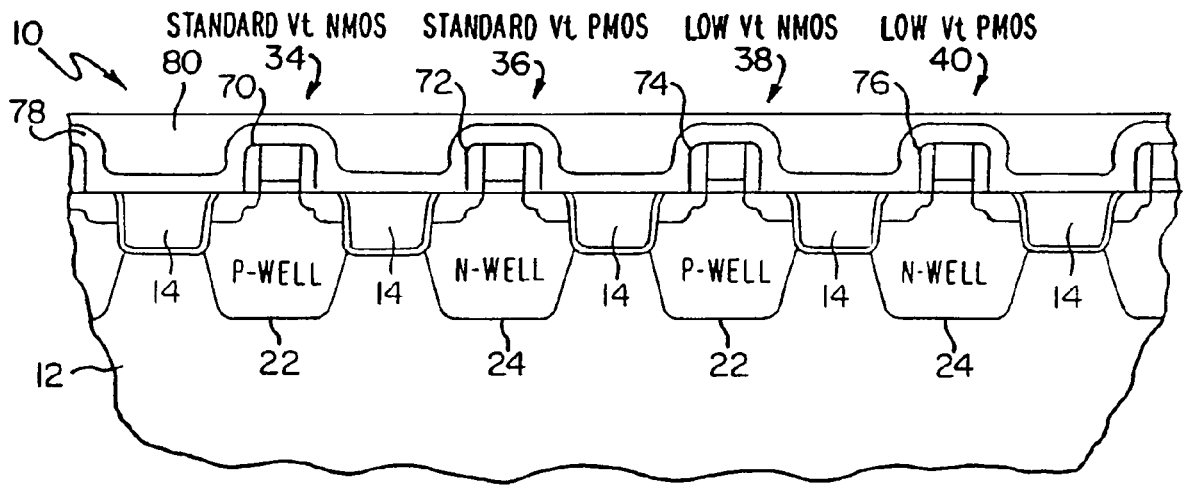
FIG. 11 is a diagrammatic section view of a process for the fabrication of low and standard voltage devices according to one embodiment of the present invention wherein additional processes are performed to complete the device shown in FIG. 10.

Referring to FIG. 11, a first dielectric layer 78 such as a conformal tetraethyloxysilicate (TEOS), oxide, or nitride layer is deposited over the dual Vt CMOS device 10. The first dielectric layer 78 serves as a barrier layer for subsequent manufacturing processes. Further, a thick, second dielectric layer 80 is deposited over the first dielectric layer 78. It shall be appreciated that additional processing steps may be preformed to connect the standard and low Vt NMOS and PMOS devices 70, 72, 74, 76 to other circuit elements and layers of metallization. For example, the standard and low Vt NMOS and PMOS devices 70, 72, 74, 76 may be connected to back end of line wiring (BEOL). The BEOL wiring completes the circuits designed within the integrated circuit device. Any other semiconductor fabrication techniques may be employed as is known in the art to complete the desired structure.

Figure 12A:
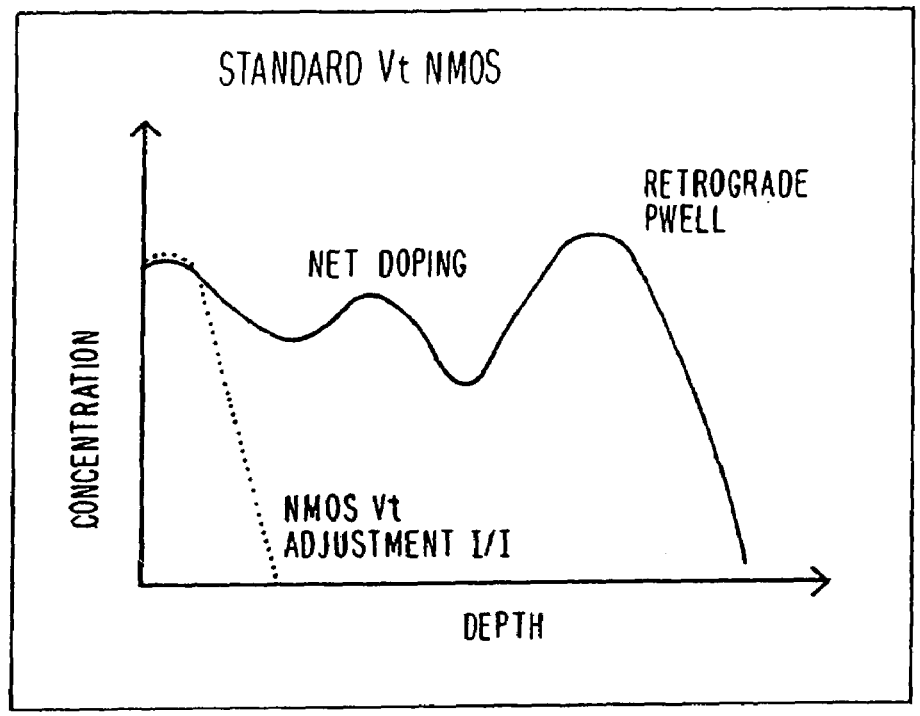
FIG. 12A–12D illustrate the doping profiles of standard voltage threshold and low voltage threshold devices; and, FIG. 13A–13B represent a flow chart setting out the processing steps for the fabrication of a low voltage and standard voltage devices according to one embodiment of the present invention.
Figure 12B:
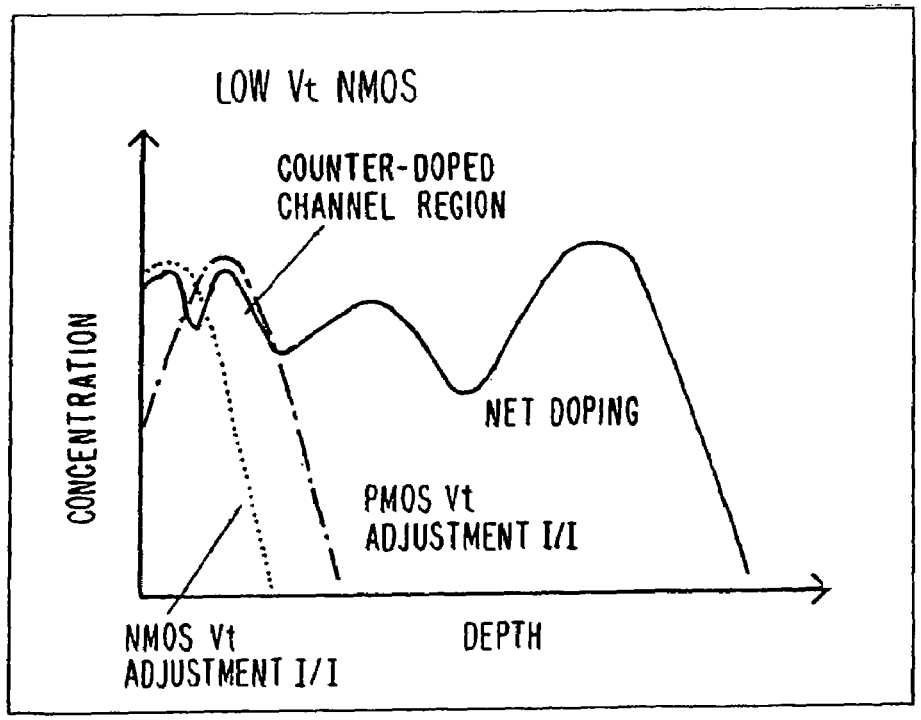
Figure 12C:
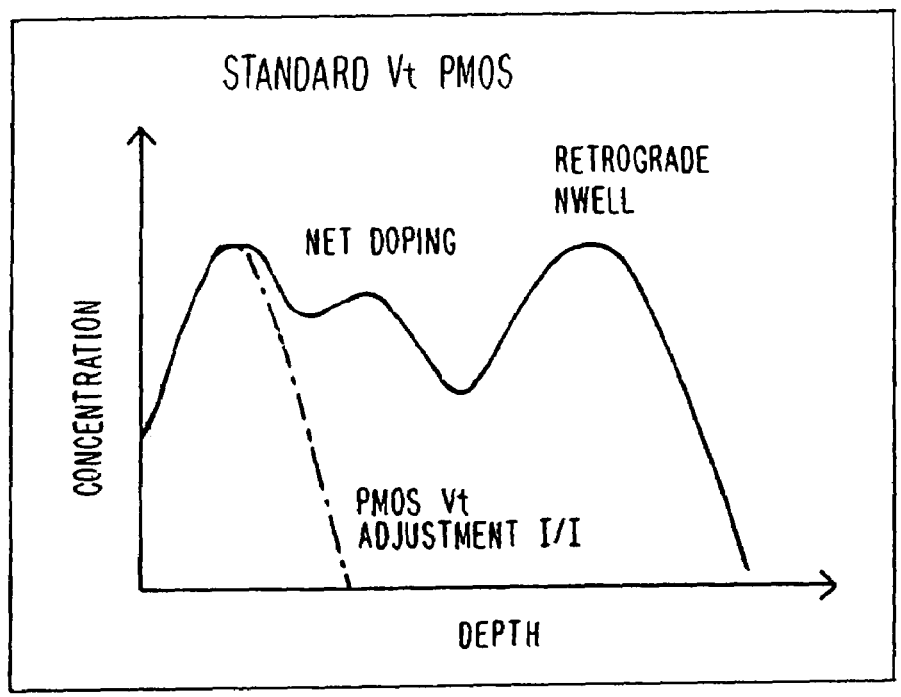
Figure 12D:
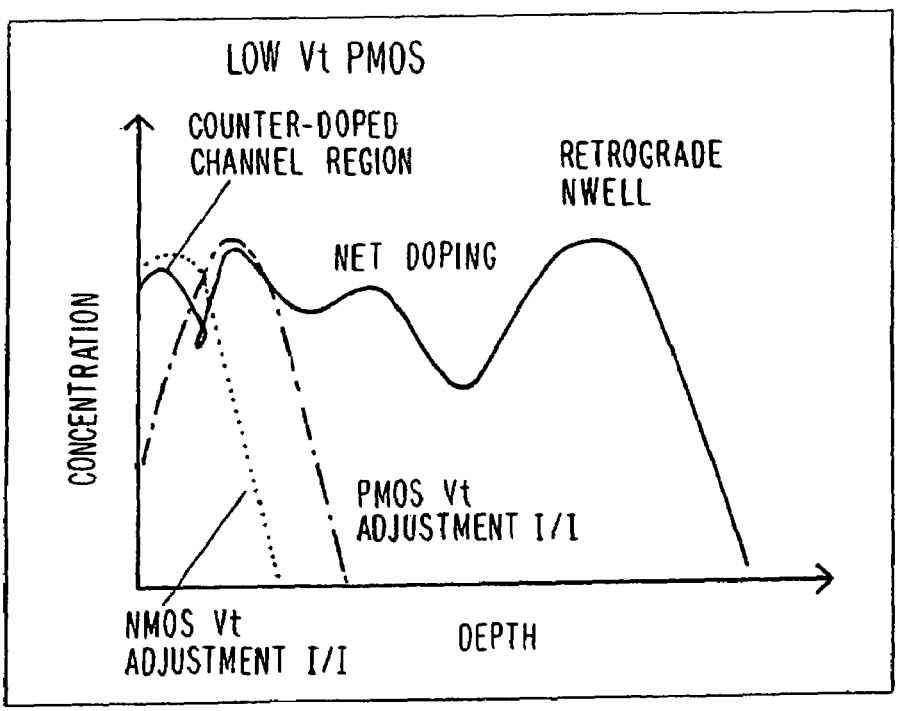

During the fabrication processing operations described with reference to FIGS. 2 and 3, the low Vt PMOS and NMOS regions are exposed to both the first and second Vt adjustment ion implants. The graphs presented in FIGS. 12A–12D illustrate generally, an example of the net effect of both the first and second Vt adjustment ion implants on both the standard and low Vt PMOS and NMOS devices 70, 72, 74, 76 that may be realizable according to one embodiment of the present invention. FIG. 12A represents the channel doping profile for a standard Vt NMOS device. FIG. 12B shows the corresponding channel doping profile of a relatively lower Vt NMOS device as compared to the device of FIG. 12A. Likewise, FIG. 12C represents the channel doping profile for a standard Vt PMOS device. FIG. 12D shows the corresponding channel doping profile of a relatively lower Vt PMOS device as compared to the device of FIG. 12C.

Each of the graphs in FIGS. 12A–12D plot the channel doping profiles. The Concentration of doping is plotted on the Y-axis, and the Depth of dopant is plotted on the X-axis. FIG. 12A is illustrative of the doping profile that may be expected for the standard Vt NMOS device according to one embodiment of the present invention. The solid line in the chart illustrates the net doping of the retrograde P-type well. The dotted line illustrates the NMOS Vt adjustment I/I. FIG. 12B is illustrative of the channel doping profile for a low Vt NMOS device fabricated in the same processing operations as the standard Vt NMOS device illustrated in FIG. 12A. Again the solid line illustrates the net doping of the retrograde P-type well. The dotted line illustrates the NMOS Vt adjustment I/I. The dotted and dashed line illustrates the PMOS Vt adjustment I/I. Contrasting FIG. 12A with FIG. 12B, FIG. 12B illustrates a counter-doped channel region that does not have a corresponding counterpart in the standard Vt NMOS device channel doping profile shown in FIG. 12A. FIGS. 12A and 12B suggest a relatively lower Vt in the device of FIG. 12B than the device measured for FIG. 12A.

FIG. 12C is illustrative of the doping profile that may be expected for the standard Vt PMOS device according to one embodiment of the present invention. The solid line in the chart illustrates the net doping of the retrograde N-type well.

The dotted line illustrates the PMOS Vt adjustment VI. FIG. 12D is illustrative of the channel doping profile for a low Vt PMOS device fabricated in the same processing operations as the standard Vt PMOS device illustrated in FIG. 12C. Again, the solid line illustrates the net doping of the retrograde N-type well. The dotted line illustrates the NMOS Vt adjustment I/I. The dotted and dashed line illustrates the PMOS Vt adjustment I/I. Contrasting FIG. 12C with FIG. 12D, FIG. 12D illustrates a counter-doped channel region that does not have a corresponding counterpart in the standard Vt PMOS device channel doping profile shown in FIG. 12C. FIGS. 12C and 12D suggest a relatively lower Vt in the device of FIG. 12D than the device measured for FIG. 12C.

According to one embodiment of the present invention, halo implants, the Vt implant adjustments discussed with reference to FIGS. 2 and 3, and the doped polysilicon gate stack formation discussed with reference to FIGS. 5–6 combine to set the realizable Vt of a particular MOSFET device. For example, according to one embodiment of the present invention, a dual gate surface-channel CMOS process comprises the fabrication of N+ polysilicon gates for all NMOS devices, and P+ polysilicon gates for all PMOS devices. The differentiation of the N+ and P+ polysilicon gates enables the fabrication of low Vt PMOS devices, allows control of device Vt and device performance characteristics. One embodiment of the present invention fabricates the standard and low voltage devices in such a manner so as to selectively allow the standard and low voltage devices to operate in the depletion mode as well as in enhancement mode.

It will be appreciated that for each implant or dopant discussed above, the depth of penetration into the substrate and the concentration of the dopant or implant will be application specific. According to one embodiment of the present invention, each implant is controlled by regulating at least the energy and concentration of the implantation process. Further, device performance, including for example, the voltage threshold realized for a particular device, will be dependant upon the implant processes utilized.

Referring to FIGS. 13A–13B, a flow chart 100 outlines a sequence for the fabrication of dual Vt CMOS devices including standard and low Vt devices according to one embodiment of the present invention. Initially, isolation regions are formed in a substrate at 102. Wells are formed in the substrate at 104, and a sacrificial oxide is formed over the substrate at 106. Vt adjustments are made for standard Vt NMOS devices at 108 and Vt adjustments are performed for standard Vt PMOS devices at 110. A gate oxide is formed over each well at 112, polysilicon is deposited over the gate oxides and suitably doped at optional 114. The polysilicon is etched as necessary to form gate stacks over the wells at 116. Any necessary ion depositions are carried out at 118. Gate spacers are formed at 120 and source drain implants are performed at 122. The implants are optionally activated at 124 and any contacts, metallization, and back end of line (BEOL) processes are performed at 126. The nature of any contacts, metallization and further circuit processing will depend upon the exact structure.

The various embodiments of the present invention are applicable to the fabrication of any CMOS device where it is desirable to form standard and low voltage threshold devices. Further, various embodiments of the present invention allow the formation of dual gate CMOS devices. That is, all the NMOS transistors have N+ poly gates and all the PMOS transistors have P+ poly gates.

Having described the invention in detail and by reference to preferred embodiments thereof, it will be apparent that modifications and variations are possible without departing from the scope of the invention defined in the appended claims.

What is claimed is:

1. A method of forming a CMOS device comprising:
   forming a plurality of isolation regions in a substrate;
   forming at least two first type wells in said substrate;
   forming at least two second type wells in said substrate;
   providing a first mask over said substrate overlying at least one of said first type wells;
   doping said substrate with a first voltage threshold implant;
   removing said first mask;
   providing a second mask over said substrate overlying at least one of said second type wells;
   doping said substrate with a second voltage threshold implant;
   removing said second mask;
   forming a gate oxide over said first and second type wells;
   depositing a gate conductor over said substrate;
   providing a third mask overlying each of said first type wells;
   doping said gate conductor with a first gate conductor dopant;
   removing said third mask;
   providing a fourth mask overlying each of said second well types;
   doping said gate conductor with a second gate conductor dopant;
   removing said fourth mask;
   forming a plurality of gate stacks over said substrate, at least one gate stack formed over each of said first and second type well; and
   forming source/drain regions in said substrate about said gate stacks.

2. The method of claim 1, further comprising:
   lining said plurality of isolation regions with a oxide layer; and
   filling each trench with a dielectric material over said oxide layer.

3. The method of claim 1, wherein said at least two first type wells are formed at locations in said substrate defined by a standard voltage first type region and a low voltage threshold first type region.

4. The method of claim 1, wherein said at least two first type wells are P-type wells.

5. The method of claim 4, wherein said P-type wells are formed by implanting a P-type dopant into said substrate.

6. The method of claim 5, wherein said P-type dopant comprises a trivalent element.

7. The method of claim 1, wherein said at least two second type wells are formed at locations in said substrate defined by a standard voltage second type region and a low voltage threshold second type region.

8. The method of claim 1, wherein said at least two second type wells are N-type wells.

9. The method of claim 8, wherein said N-type wells are formed by implanting a N-type dopant into said substrate.

10. The method of claim 9, wherein said N-type dopant comprises a pentavalent element.

11. The method of claim 1, further comprising:
   forming a sacrificial oxide layer over said substrate before providing said first mask; and
   removing said sacrificial oxide layer after said removal of said second mask.

12. The method of claim 1, wherein said first voltage threshold implant comprises an implant of arsenic.

13. The method of claim 1, wherein said second voltage threshold implant comprises an implant of boron.

14. The method of claim 1, wherein said second voltage threshold implant comprises an implant of indium.

15. The method of claim 1, further comprising:
removing portions of said gate oxide from surface of said substrate.

16. The method of claim 1, wherein said first gate conductor dopant is a P-type impurity.

17. The method of claim 1, wherein said second gate conductor dopant is a N-type impurity.

18. The method of claim 1, further comprising:
annealing said gate conductor after said doping of said gate conductor with said second gate conductor dopant.

19. The method of claim 1, further comprising:
forming a spacer layer over said substrate after said formation of said plurality of gate stacks; and
removing portions of said spacer layer to define spacers against the vertical walls of said plurality of gate stacks.

20. The method of claim 1, further comprising:
annealing said CMOS device after said formation of said source/drain regions.

21. The method of claim 1, further comprising:
depositing a barrier dielectric layer over said CMOS device after said formation of said source/drain regions; and
depositing a second thicker dielectric layer over said barrier dielectric layer.

22. The method of claim 1, wherein said providing said first mask further comprises:
masking said second type wells by said first mask define standard voltage threshold first type regions and not masking said second type wells by said first mask define low voltage threshold first type regions.

23. The method of claim 1, wherein said providing a second mask further comprises:
masking said first type wells by said second mask define standard voltage threshold second type regions and not masking said first well types by said second mask define low voltage threshold second type regions.

24. A method of forming a CMOS device comprising:
forming a plurality of isolation regions in a substrate;
forming a first well in said substrate defining at least one standard voltage threshold first type region;
forming a second well in said substrate defining at least one standard voltage threshold second type region;
forming a third well in said substrate defining at least one low voltage threshold first type region;
forming a fourth well in said substrate defining at least one low voltage threshold second type region;
forming a sacrificial oxide layer over said substrate;
doping said substrate with a first voltage threshold implant such that each standard voltage threshold second type region, each low voltage threshold first type region, and each low voltage threshold second type region is exposed to said first voltage threshold implant;
doping said substrate with a second voltage threshold implant such that each standard voltage threshold first type region, each low voltage threshold first type region, and each low voltage threshold second type region is exposed to said second voltage threshold implant;
forming a gate oxide layer over said substrate;
forming a polysilicon gate over each of said first, second, third, and fourth wells;
doping said polysilicon gates over each of said first and third wells with a first gate conductor dopant;
doping said polysilicon gates over each of said second and fourth wells with a second gate conductor dopant;
etching each of said polysilicon gates to form polysilicon gate stacks;
performing at least one implant into said substrate;
forming gate spacers about each of said polysilicon gate stacks;
forming source/drain implants into said substrate;
activating dopants and implants within said CMOS device; and
forming contact and metallization lines to define said CMOS device.

25. The method of claim 24, further comprising:
lining said plurality of isolation regions with a oxide layer; and
filling each trench with a dielectric material over said oxide layer, wherein upper portion of said dielectric material is planar and generally parallel to the surface of the substrate.

26. The method of claim 24, wherein said first wells and said third well are P-type wells.

27. The method of claim 26, wherein said P-type wells are formed by implanting a P-type dopant into said substrate.

28. The method of claim 27, wherein said P-type dopant comprises a trivalent element.

29. The method of claim 24, wherein said second wells and said forth well are N-type wells.

30. The method of claim 29, wherein said N-type wells are formed by implanting a N-type dopant into said substrate.

31. The method of claim 30, wherein said N-type dopant comprises a pentavalent element.

32. The method of claim 24, further comprising:
annealing said polysilicon gates after said doping of said polysilicon gates with said second gate conductor dopant.

* * * * *